United States Patent [19]

Lonseth et al.

[11] 4,451,870

[45] May 29, 1984

[54] CAPACITIVE SIGNAL COUPLER

[75] Inventors: Palmer Lonseth; Neil R. Selkirk; Donald G. Moorby, all of Peterborough, Canada

[73] Assignee: Canadian General Electric Company Limited, Toronto, Canada

[21] Appl. No.: 443,565

[22] Filed: Nov. 22, 1982

[30] Foreign Application Priority Data

Dec. 4, 1981 [CA] Canada ............................ 391540

[51] Int. Cl.³ ..................... H01G 9/00; H01L 27/02
[52] U.S. Cl. ................................. 361/433; 357/51
[58] Field of Search .................. 310/67, 68 C, 260; 361/433; 357/51

[56] References Cited

U.S. PATENT DOCUMENTS

| | | | |
|---|---|---|---|
| 1,856,392 | 5/1932 | Kevelson | 361/433 X |
| 4,107,762 | 8/1978 | Shirn et al. | 361/433 |
| 4,169,271 | 9/1979 | Saitoh | 357/51 |
| 4,245,187 | 1/1981 | Wagner et al. | 324/54 |

FOREIGN PATENT DOCUMENTS 973932 9/1975 Canada .
1078017 5/1980 Canada .

*Primary Examiner*—Donald A. Griffin
*Attorney, Agent, or Firm*—Raymond A. Eckersley

[57] ABSTRACT

A capacitive signal coupler for use with a large dynamoelectric machine for coupling signals indicative of corona discharge from the stator bars to a monitor system is combined with an end cap made to fit over the connector extending between two stator bars. The end cap has a high voltage capacitor encapsulated in its walls. One lead from the capacitor is fastened to the connector with a screw before the end cap is installed. The other lead projects from the end cap and is connected to one terminal of a high voltage fuse. The fuse is secured to the end cap. The other terminal of the fuse is adapted to be connected to a cable leading to a monitor system. The coupler is preferably fastened to the lower end of the conductors of a vertical dynamoelectric machine where there is a full range of choice of location in the circuit voltages from line to neutral in two bar steps. The end cap is epoxy sealed in place to make an installation requiring little more space than the installation of a normal end cap.

6 Claims, 2 Drawing Figures

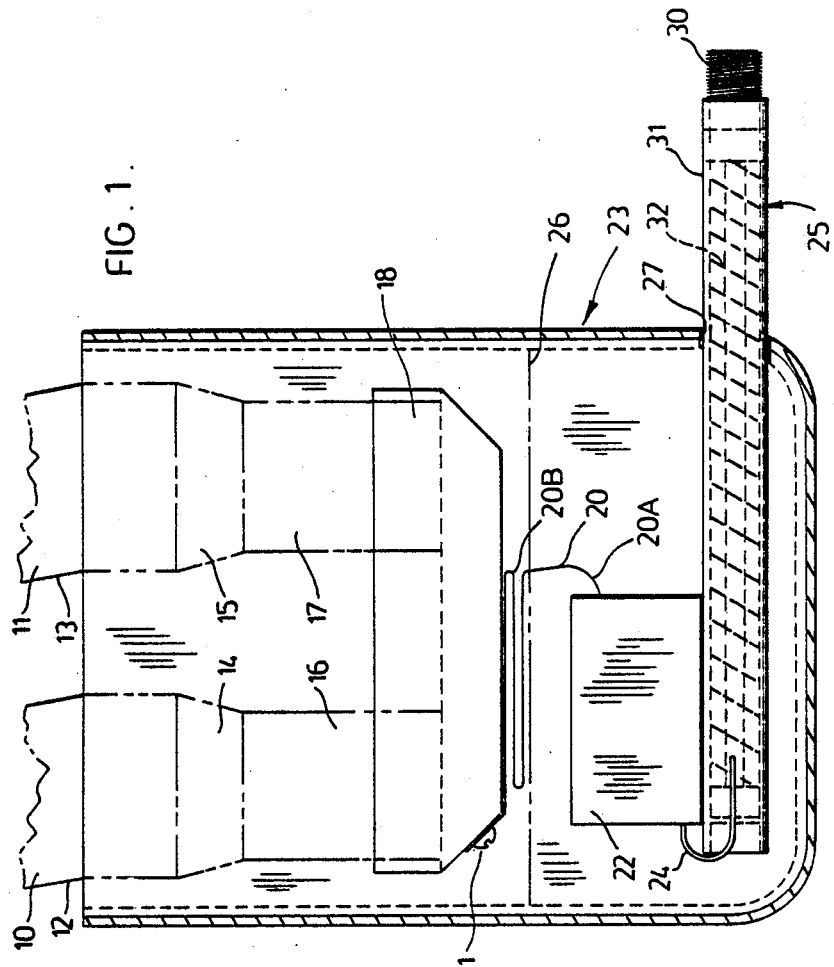
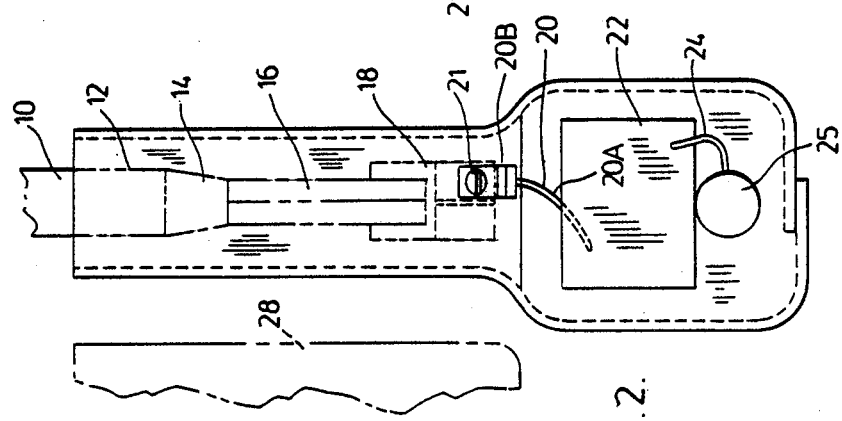

CAPACITIVE SIGNAL COUPLER

FIELD OF THE INVENTION

This invention relates to a capacitive signal coupler for coupling signals indicative of corona discharge in the stator of an electrical machine to a monitor system.

BACKGROUND OF THE INVENTION

In dynamoelectric machines, and particularly in larger salient pole dynamoelectric machines, the stator winding normally comprises several conductors or bars in slots. The conductors or bars are surrounded by insulation with an armor jacket, which is often a partly conductive armor jacket, overlying the insulation at least on the outer side walls of the bar in the slot. The term "partly conductive" is used only to indicate a conductive material having a resistance which permits current flow but is considerably less conductive than the conductors used in the dynamoelectric machine. The conductors or bars are fitted into the respective slots in the stator core laminations and secured by wedging or other means. Initially the partly conductive armor jacket covering the bar or coil side makes good electrical contact with the edges of the laminations which define the slot in which it is located. Thus, the partially conductive armor jacket will be at the same potential as the core. The bar vibration caused largely by the electromagnetic forces in the machine, along with thermal expansion and contraction, may in time reduce the integrity of the contact between the partially conductive armor jacket and the core laminations. The laminations are not all identical and some project very slightly farther into the slot than others. This slight non-uniformity in the slot wall may increase the tendency to lose contact as a result of bar movement caused by vibration and by thermal expansion and contraction. When the effectiveness of the contact is sufficiently reduced between the armor jacket and the laminations, the capacitive current that is normally drained to ground through the partially conductive armor will not have an adequately low resistance path through which to flow. As a result, voltage gradients sufficient to cause various types of corona and slot discharge may occur. As higher operating voltages are used in dynamoelectric machines there is a greater tendency for corona discharge to occur. It is well known that in the presence of intense corona discharge (particularly a spark type discharge) an insulating material can be eroded and eventually break down.

It will be apparent that if the presence of corona discharge could be detected in an operating dynamoelectric machine, the machine could be shut down and a repair made before the problem developed into a serious fault. There have been a number of design approaches which have been tried in order to accomplish this and they have had various degrees of success. One approach detected corona discharge using acoustic energy by placing sound detectors adjacent to the dynamoelectric machine to detect acoustic energy in the sonic or ultrasonic region. So far the results have not been sufficiently consistent for use in an operating machine. Another approach was to detect the high frequency energy of a corona discharge by installing an antenna on the rotor of a dynamoelectric machine to pick up the high frequency discharge as the antenna passed over the stator slots. This system, which is described in Canadian Pat. No. 1,078,017—Freeman, issued May 20, 1980 and assigned to the Canadian General Electric Company Limited, requires considerable attention to the reduction of the background noise of the operating environment of a normal dynamoelectric machine and consequently tends to be relatively expensive. Another approach connects capacitors directly to a winding in the dynamoelectric machine stator to couple the high frequency signal of corona discharge to a detector system. The present invention is concerned with this approach.

A number of years ago attempts were made to couple out the high frequency signal representing corona discharge by connecting a high voltage capacitor to a machine terminal and filter out the power frequency. This, of course, could not successfully localize the signal source. An improvement involved building a capacitor around the insulated conductor or around an insulated connector using a metal mesh and connecting the capacitor to an externally located detecting system. It was, however, found to be difficult to make the capacitors uniform and the results were not sufficiently reliable.

Another version used a high voltage coaxial cable of perhaps a two to three foot length to give a desired capacitance, formed into a loop and connected directly to the bare conductor at the top end of the stator winding. The hole through the insulation for connection of the cable had to be re-sealed after the cable was installed. The cable was bulky, the installation was somewhat difficult and the results were not entirely satisfactory.

A very simple version is to connect high voltage capacitors to the top end of the stator conductors by cutting through the insulation, mounting the capacitor in place, and running an insulated conductor from the other side of the capacitor to a monitor system or utilization system. This is functional and provides a suitable signal. However, the installation is bulky requiring additional space, and it has in the past been a hand installation.

SUMMARY OF THE INVENTION

It is an object of the present invention to provide an improved capacitive signal coupler for use with a dynamoelectric machine.

It is another object of the invention to provide a unit which includes a capacitor built into an end cap and a series high voltage fuse for coupling corona signals to a utilization device.

The present invention incorporates a capacitor within an end cap for an end head on the lower end of the stator and preferably includes a series fuse. The incorporation of the capacitor within the end cap makes a more compact unit with a uniform mounting. The installation is simple and the insulating cap is epoxy sealed. A range of locations from line to neutral is available in two bar steps at the lower end. The high voltage fuse provides a disconnect in the event of capacitor failure.

Accordingly there is provided a capacitive signal coupler for coupling signals indicative of corona discharge from stator conductors of a dynamoelectric machine to a monitor system, comprising insulating means for covering and insulating the ends of stator conductors connected by a connector, a capacitor encapsulated in said insulation means and having first and second leads, said first lead being arranged for connection to said connector, a high voltage fuse having a first and a second terminal means, and means for connecting said first terminal means with said second lead.

BRIEF DESCRIPTION OF THE DRAWINGS

FIG. 1 is a front view of an assembly of an end cap, capacitor and fuse according to one form of the invention, and FIG. 2 is a side view of the assembly of FIG. 1.

DESCRIPTION OF THE PREFERRED EMBODIMENTS

Referring to FIGS. 1 and 2, two insulated conductor bars, designated generally as 10 and 11, are shown as they might appear projecting from the lower end of a stator core (not shown). The insulation 12 and 13 on bars 10 and 11 respectively terminates at 14 and 15. The conductors themselves are shown as 16 and 17. An end head connector 18 connects the conductors 16 and 17 and may be brazed or welded to conductors 16 and 17. A wire or strip conductor 20 is fastened at one end to connector 18 by a screw 21. The other end of connector 20 is connected to one terminal of a high voltage capacitor 22. An end cap 23 comprises a casing which is conveniently in two portions 23A and 23B, filled with a resinous material, for example, an epoxy resin which encapsulates capacitor 22 and surrounds and embeds the ends of conductors 16 and 17 extending past the termination 14 and 15 of the insulation.

A lead or wire conductor 24 extends from the other terminal of capacitor 22 to a high voltage fuse 25. Preferably the high voltage fuse 25 is a cartridge fuse having a cylindrical casing 31 which contains a helical fuse wire 32. The conductor 24 connects with one end of fuse wire 32. The other end of fuse wire 32 is connected to the center connection of a screw connector 30 mounted to the end of fuse 25 remote from conductor 24. In a preferred embodiment the fuse 25 projects through an opening 27 in the casing of the end cap 23, as shown. The screw connector 30 provides a connection for a conductor, preferably a shielded conductor, which extends to a monitor system or utilization system (not shown).

The installation of the capacitive coupler is simple and is uniform as between couplers. The end cap units are made beforehand. The two halves or portions 23A and 23B of the end cap are placed together with the open end upwards. The cartridge fuse 25 is placed in the end cap, projecting through opening 27. The capacitor 22 is positioned with the connection 24 made between the fuse wire 32 and one side of high voltage capacitor 22. The other lead 20 of capacitor 22 is sufficiently long to extend above the open end of the end cap and it is temporarily held in its extended position. Epoxy resin is poured into the end cap 23 up to about the level indicated by broken line 26 in FIG. 1. When the epoxy resin sets, the end cap unit is ready to be installed. The end cap portions 23A and 23B are held together by the epoxy resin, and capacitor 22 and fuse 25 are encapsulated and secured by the epoxy resin.

The end of conductor 20 is now secured to the series connector 18. It will be recalled that conductor 20 is long enough to extend beyond the open end of end cap 23 so the end of conductor 20 is easily secured to series connector 18 with screw 21. The end cap 23 is then raised in position so that it surrounds the conductors 10 and 11 as shown in the drawings, and epoxy resin is poured into the end cap.

The conductor 20 may consist of a lead wire 20A which extends from capacitor 22 and a strip conductor 20B which is soldered or otherwise affixed to the end of lead wire 20A, substantially as shown. The conductor 20B is conveniently above level 26 and is arranged to fold back and forth when the end cap is mounted on the dynamoelectric machine.

It will be seen from FIG. 2, where broken line 28 represents the approximate position of an adjacent end cap of standard construction, that two of the capacitive signal coupler end caps cannot be adjacent one another because of space requirements. They can, if desired, be mounted with only one intermediate standard end cap. Normally there may be several couplers installed for each phase with the leads connected between respective connectors 30 and a monitor system or utilization system. Because the energy provided by a corona discharge appears to be in a fairly wide frequency spectrum, perhaps between 0.5 MHz and 100 MHz, it is desirable that the monitor system include a filter and preferably an adjustable band pass filter so that the frequency spectrum of interest can be scanned. The various leads from the couplers may be connected individually to a display, such as, for example, an oscilloscope, or to a pulse counter. Circuitry similar to the circuitry described in the aforementioned Freeman Canadian Pat. No. 1,078,017 is suitable for analysing or recording the signals appearing on the various leads.

While the actual values of the components will vary from one installation to the next, depending on the rating of the dynamoelectric machine and the electrical requirements, a typical hydro-electric generator might use, by way of example only, a capacitor of the order of 80 pico-farads and an 8 kV AC rating, and a high voltage fuse with a one half ampere rating.

It is believed that the preceding description will provide a complete understanding of the invention.

What we claim as new and desire to secure by Letters Patent of the United States is:

1. A capacitive signal coupler for coupling signals indicative of corona discharge from stator conductors of a dynamoelectric machine to a monitor system, comprising
    insulating means for covering and insulating the ends of stator conductors connected by a connector,
    a capacitor encapsulated in said insulation means and having first and second leads, said first lead being arranged for connection to said connector,
    a high voltage fuse having a first and a second terminal means, and
    means for connecting said first terminal means with said second lead.

2. A capacitive signal coupler as defined in claim 1 in which said insulating means is an end cap.

3. A capacitive signal coupler as defined in claim 2 in which said end cap is a split end cap having two cooperating portions for placing over said ends and connector to form an end cap.

4. A capacitive signal coupler, as defined in claim 2, in which said fuse is a cartridge fuse mounted internally of said end cap with said second terminal means projecting therefrom and in which said second terminal means is a screw connector.

5. A capacitive signal coupler for coupling signals indicative of corona discharge from stator conductors of a vertically mounted dynamoelectric machine, said stator conductors having ends projecting from a lower end of a stator core with adjacent ones of said ends being connected with an end head connector extending between said ends, said coupler comprising in combination an end cap of insulating material for covering and insulating said connector and said ends connected by said connector, a high voltage capacitor encapsulated in said end cap and having a first and second lead, screw means for connecting said first lead to said connector, a high voltage cartridge fuse having first and second terminals at opposite ends thereof mounted internally of said end cap and encapsulated therein with said second terminal projecting therefrom, and means for connecting said first terminal and said second lead, said second terminal being a screw connector for connection of a cable from said screw connector to a monitor system.

6. A capacitive signal coupler as defined in claim 5 in which the encapsulating material is an epoxy resin.

* * * * *